US008123386B2

(12) United States Patent
Moshtagh

(10) Patent No.: US 8,123,386 B2
(45) Date of Patent: Feb. 28, 2012

(54) SHAPE FORMING HEAT SINK WITH FLEXIBLE HEAT ROD

(75) Inventor: Vahid S. Moshtagh, San Jose, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/909,802

(22) Filed: Oct. 21, 2010

(65) Prior Publication Data

US 2011/0069503 A1 Mar. 24, 2011

(51) Int. Cl.
*F21V 29/00* (2006.01)
*B23P 19/04* (2006.01)
*H05K 7/20* (2006.01)

(52) U.S. Cl. .......................................... 362/373; 362/294

(58) Field of Classification Search .................. 362/373, 362/294, 345, 580, 218, 126, 547, 800; 29/428; 361/707
See application file for complete search history.

(56) References Cited

U.S. PATENT DOCUMENTS 4,419,719 A * 12/1983 Boer et al. .................... 362/294
4,974,119 A 11/1990 Martin .......................... 361/386
5,782,555 A 7/1998 Hochstein ..................... 362/373
7,278,761 B2 10/2007 Kuan ............................ 362/294
7,641,363 B1 * 1/2010 Chang et al. .................. 362/294
7,755,282 B2 7/2010 Sun et al. ...................... 313/512
7,784,970 B2 8/2010 Sun .............................. 362/294
7,800,909 B2 9/2010 Sun .............................. 361/709

* cited by examiner

*Primary Examiner* — Bao Q Truong
(74) *Attorney, Agent, or Firm* — Imperium Patent Works; Darien K. Wallace

(57) ABSTRACT

A conforming heat dissipating structure transfers heat to an irregular surface from a heat source mounted on its bottom surface. The heat dissipating structure includes an open container filled with metal shavings and balls covered by a flexible retainer. The shavings and balls beneath the flexible retainer are pressed against the irregular surface and conform to its irregular shape. In one application, light emitting diodes are mounted to the bottom of the heat dissipating structure, and the shavings are compressed against the inside cover of a street light. A flexible heat rod enables heat to be transferred over a flexible path from a heat source on one heat dissipating structure to a heat sink pressed against another heat dissipating structure. The many strands that make up the flexible heat rod are spread out inside each open container and are pressed between the metallic shavings to achieve a good thermal contact.

20 Claims, 9 Drawing Sheets

SHAPE FORMING HEAT SINK WITH FLEXIBLE HEAT ROD

TECHNICAL FIELD

The present invention relates generally to heat sinks and, more specifically, to a heat dissipating structure that conforms to an irregular surface to which heat is to be transferred.

BACKGROUND INFORMATION

Light emitting diodes (LEDs) provide an energy-efficient light source and are increasingly being used instead of fluorescent and halogen gas lamps for high capacity lighting needs, such as street lamps. In order to increase the amount of light generated, LEDs are often incorporated into street lamps, which can lead to significant problems of overheating. The performance and lifetime of the LEDs is degraded if the operating temperature exceeds a threshold level. For example, the useful life of an LED street lamp is sometimes specified as the number hours of operation before which the luminous output of the lamp drops to half of its initial output. Empirical data suggests that there is an inverse exponential relationship between the useful life of an LED lamp and the amount by which the average operating temperature exceeds a threshold level, such as 25 degrees Celsius. Thus, dissipating the heat generated by the LEDs in the street lamp is a problem that must be solved.

The LEDs of a street lamp are enclosed by a covering. The covering typically has openings to allow the heat generated by the LEDs to escape the covering. However, the openings allow dust, moisture and insects to enter the covering and to block much of the light that is generated.

FIG. 1 (prior art) shows an existing LED street lamp 10 that does not permit dust, moisture and insects to obstruct the transparent lower cover 11 through which the generated light shines onto the street. Transparent lower cover 11 is kept free of dust, moisture and insects by completely sealing off the lower compartment below the LEDs. Consequently, most of the heat generated by the LEDs must be dissipated through the upper compartment. The heat is transmitted from the LEDs to a heat conducting plate 12. The heat then passes on to heat-dissipating fins 13 via a heat guiding piece 14. Heat is dissipated out of the upper compartment by fans 15 that blow heated air out of venting slots 16 in the upper cover 17. For additional details on this prior art method of dissipating heat from a street lamp, see U.S. Pat. No. 7,278,761 to Kuan entitled "Heat Dissipating Pole Illumination Device."

This prior art method of dissipating heat from an LED street light has multiple disadvantages. First, although dust, moisture and insects are prevented from entering the lower compartment, they will nevertheless enter the upper compartment through the venting slots 16. The dust, moisture and insects will likely clog the spaces between the fins 13 and reduce the ability of the fins to dissipate heat. Second, the fans 15 have moving parts and will likely malfunction, especially if they are subjected to the dust, moisture and insects that enter through the venting slots 16. Moreover, the fans 15 also require a power supply, which might not be able to be shared with the LEDs. Finally, the fins 13 through which the heat guiding piece 14 extends and the fans 15 add to the cost of the street lamp.

A method is sought for dissipating heat from an LED street lamp that does not subject the inner compartments of the street lamp to dust, moisture and insects and that does not require fans or fins.

SUMMARY

A conforming heat dissipating structure transfers heat to a non-planar surface from a heat source mounted to the planar bottom surface of the heat dissipating structure. The heat dissipating structure includes an open container over-filled with metal balls that are interspersed among metallic shavings. The shavings and balls are made of a heat-conductive material, such as copper or aluminum. The upper surface of the shavings and balls is disposed above the upper rim of the open container. A flexible retainer with a copper screen covers the upper surface of the shavings and balls. The shavings and balls are pressed against the non-planar surface and are compressed so as to conform to the shape of the irregular surface. In an embodiment, the heat source is an array of light emitting diodes (LEDs) mounted to the bottom surface of the open container. And the heat sink is a dome-shaped concave surface of the upper cover of a street light. Fasteners attach the open container to the non-planar surface of the street light such that the upper surface of the metallic shavings is pressed against the non-planar surface. The fasteners can be bolts, screws, clamps, rivets or cables. The street light originally configured for gas bulbs can be retrofitted with LEDs by using the non-planar cover of the street light as a heat sink to dissipate the heat generated by the LEDs that are mounted to the bottom of the novel conforming heat dissipating structure.

A method of manufacturing the conforming heat dissipating structure involves the steps of filling an open container with metallic shavings and metal balls, covering the upper surface of the shavings and balls with a flexible retainer, and fastening a frame gasket to the open container in order to hold the flexible retainer in place over the shavings. The metal balls are interspersed among the metallic shavings. The open container is filled with copper shavings and balls beyond the upper rim of the open container to form an upper surface of the shavings. The frame gasket is fastened to the upper rim of the open container so as to hold the flexible retainer in place between the upper rim and the frame gasket. A heat source such as an array of LEDs is attached to the planar bottom surface of the open container. The open container is then attached to a non-planar surface such that the upper surface of the metallic shavings is pressed against the non-planar surface and assumes the irregular shape of the non-planar surface.

A novel conforming heat dissipating structure includes an open container and a heat source attached to the planar bottom surface of the structure. In addition, the heat dissipating structure includes a means for transmitting heat generated by the heat source to a non-planar surface above the upper rim of the open container. The means is disposed inside the open container as well as above the upper rim of the open container, and the means is adapted to be compressed between the open container and the non-planar surface. The means acquires the shape of the non-planar surface when the means is compressed.

A novel flexible heat rod enables heat to be transferred over a flexible path from a heat source to a heat sink. The flexible heat rod is made from a cable with many strands. One end of the flexible heat rod passes through a hole in the bottom of an open container, and the strands are spread out inside the open container. The open container is filled with metallic shavings and metal balls both above and below the strands. The open container, the metallic shavings, the metal balls and the flexible heat rod are made of copper. As the mixture of shavings and balls is compressed, the strands are pressed between the metallic shavings forming a good thermal contact between the flexible heat rod and the shavings. A retaining cover is fastened to the upper rim of the open container and retains the shavings and balls inside the open container.

In an embodiment, the other end of the flexible heat rod passes through a hole in the bottom of a second open container. Strands from the other end of the flexible heat rod are spread out inside the second open container. The second open container is filled with additional shavings and balls around the strands as well as above the upper rim of the second open container. A flexible retainer covers the upper surface of the additional metallic shavings. The shavings and balls are pressed against a non-planar surface so as to conform to the shape of the surface. Fasteners attach the second open container to the non-planar surface such that the upper surface of the additional metallic shavings is pressed against the non-planar surface.

In one application, the heat source is LEDs mounted to the bottom surface of the first open container. The second open container is pressed against the inside cover of a street light such that the upper surface of the metallic shavings conforms to the shape of the street light cover. The flexible heat rod provides a means for transmitting heat generated by the LEDs on a first heat dissipating structure to the irregular-shaped street light cover that is pressed against the over-filled shavings in a second conforming heat dissipating structure. The flexible heat rod can easily bend to avoid obstacles in the path between the heat source and the heat sink. In another application, the flexible heat rod is used to conduct the heat generated by a field programmable gate array (FPGA) chip out from between cramped computer components to a location where a fan can blow air through fins attached to a second heat dissipating structure. The flexible heat rod can also be used to conduct heat away from other electronic components, such as a complex programmable logic device (CPLD), a central processing unit (CPU) or a stacked memory device.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
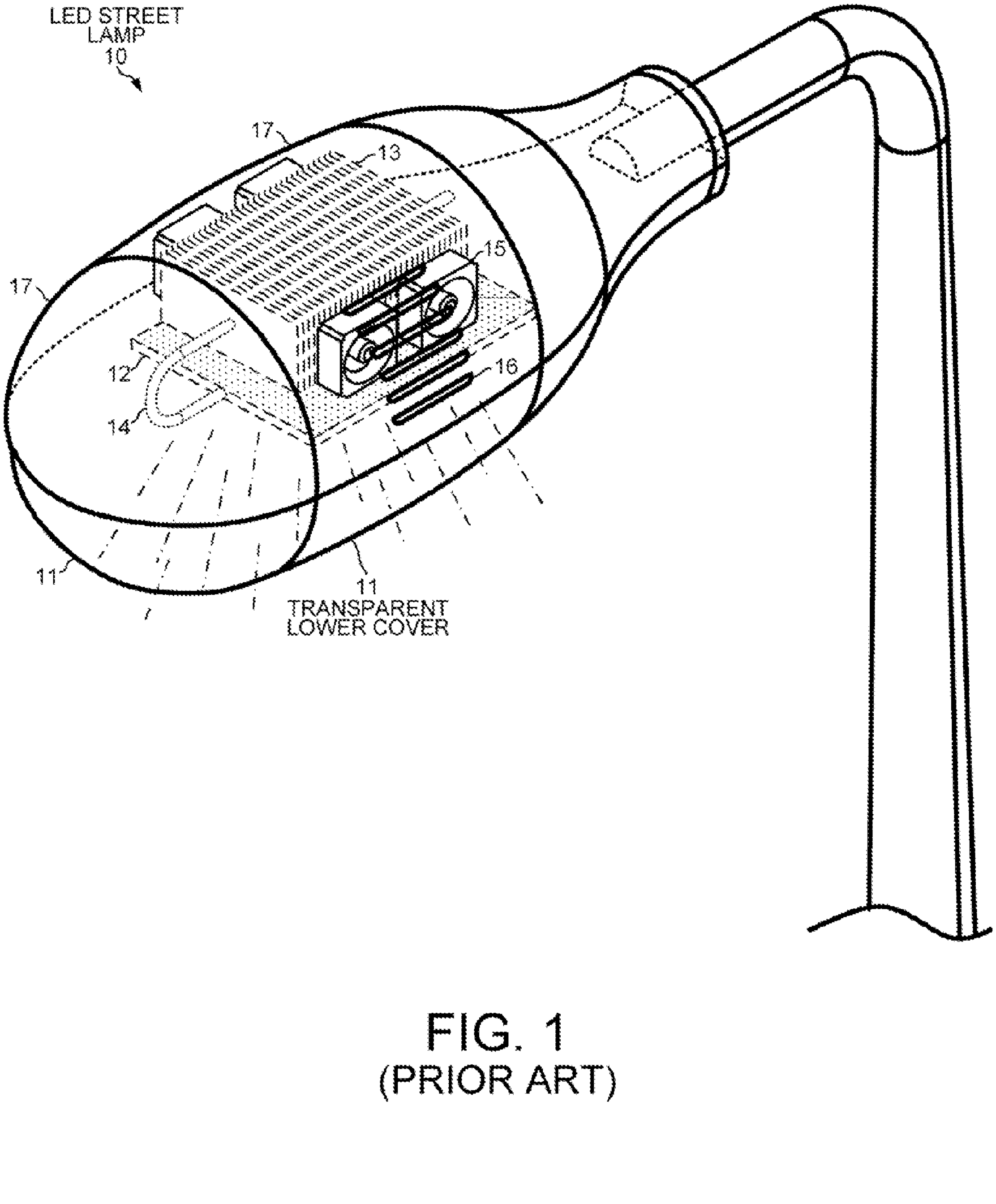
FIG. 1 (PRIOR ART)
FIG. 1 (prior art) is a perspective view of an existing LED street lamp that dissipates heat by blowing hot air out of venting slots.
Figure 2:
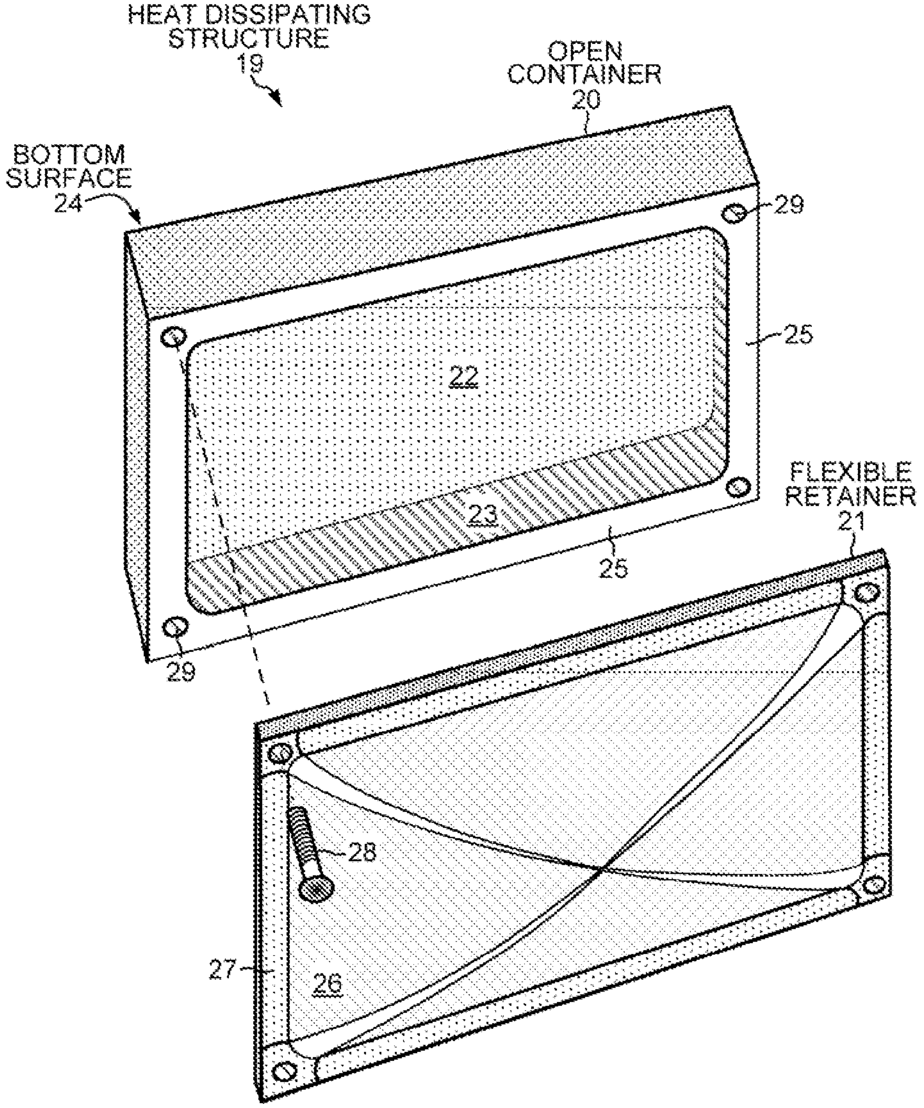
FIG. 2 is an exploded perspective view of a conforming heat dissipating structure that includes an open container covered by a flexible retainer.

FIG. 2 is an exploded top perspective view of a conforming heat dissipating structure 19 that includes an open container 20 and a flexible retainer 21. In an embodiment, open container 20 is a rectangular half box that is about ten inches long, six inches wide and one inch tall. Open container 20 has a bottom 22 and walls 23 that are about one-quarter inches thick. The bottom 22 of open container 20 has a planar bottom surface 24. The walls form an upper rim 25. Open container 20 is made of a material with a high thermal conductivity, such as copper, aluminum or a metal alloy such as aluminum 6061. Flexible retainer 21 includes a copper screen or wire mesh 26 that is held in place by a frame gasket 27. Alternatively, instead of a metal screen, a graphite sheet can be used as the mesh 26. Frame gasket 27 fits over upper rim 25 and is attached to open container 20 with fasteners 28 that screw into threaded holes 29. In FIG. 2, fasteners 28 are bolts. When frame gasket 27 is attached to open container 20, a portion of wire mesh 26 is held between frame gasket 27 and upper rim 25.

Figure 3:
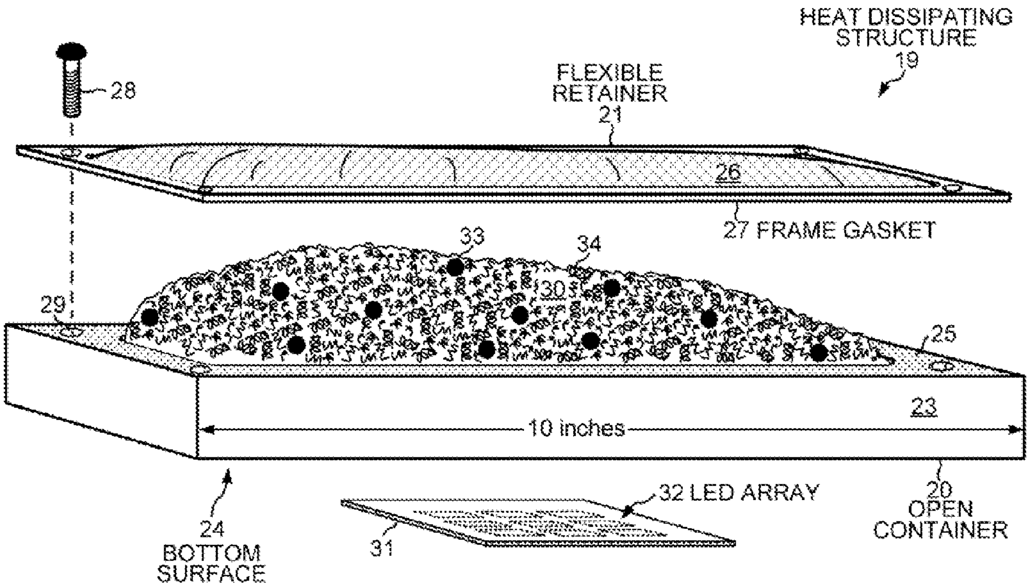
FIG. 3 is an exploded side view of the heat dissipating structure of FIG. 2 filled with metallic shavings and metal balls.

FIG. 3 is an exploded side perspective view of conforming heat dissipating structure 19 that includes flexible retainer 21, open container 20 filled with metallic shavings 30 and a platform 31 upon which a heat source is mounted. FIG. 3 shows an array of nine individual light emitting diodes (LEDs) 32 mounted to the bottom surface of platform 31. In other embodiments, an individual LED or an LED array are mounted to platform 31. Platform 31 in turn is attached to bottom surface 24 of open container 20. In an embodiment, platform 31 is made of soft aluminum to which the LEDs 32 are attached via a dielectric layer. In another embodiment, platform 31 is thermally conductive, yet electrically nonconductive. For example, platform 31 can be made of aluminum oxide ($Al_2O_3$) or aluminum nitride (AlN). Open container 20 is over-filled with the metallic shavings 30 such that the shavings are disposed in the open container as well as above upper rim 25.

Interspersed among the metal shavings 30 are metal balls 33. The metal balls add mass and thereby make the heat sink of structure 19 more efficient. The metal shavings 30 hold the metal balls 33 in place and form a malleable compress. In an embodiment, both metal shavings 30 and metal balls 33 are made of copper. The metal shavings 30 can be purchased from recycling companies that obtain the shavings from machine shops. Balls intended for bead blasting can be used as the metal balls 33. For example, copper balls are used for bead blasting where a blasting medium that is softer than steel is required. Copper balls with a diameter of 3/16 inch can be dispersed among the copper shavings 30. Balls of other sizes can also be used, for example, balls with a diameter of 1/16 inch (small), 5/64 inch (medium) or 3/32 inch (large). Flexible retainer 21 is then fastened down over upper rim 25 and holds the metal shavings 30 and metal balls 33 in place in open container 20.

In another embodiment, a graphite powder is mixed in with the shavings 30 and balls 33. The graphite powder fills in some of the air pockets between the shavings and balls and enhances the ability of the mixture to transfer heat. A graphite powder with good thermal conductivity is used, such as Primary Synthetic Graphite Powder GP55-B manufactured by GrafTech International of Clarksburg, W. Va. The graphite powder fills in more of the air pockets as the mixture of shavings, balls and powder is later compressed. In yet another embodiment, graphite balls are mixed into graphite powder instead of using metal shavings and balls. The graphite powder and ball mixture is then covered with a graphite sheet and compressed into open container 20 in a later step.

Figure 4:
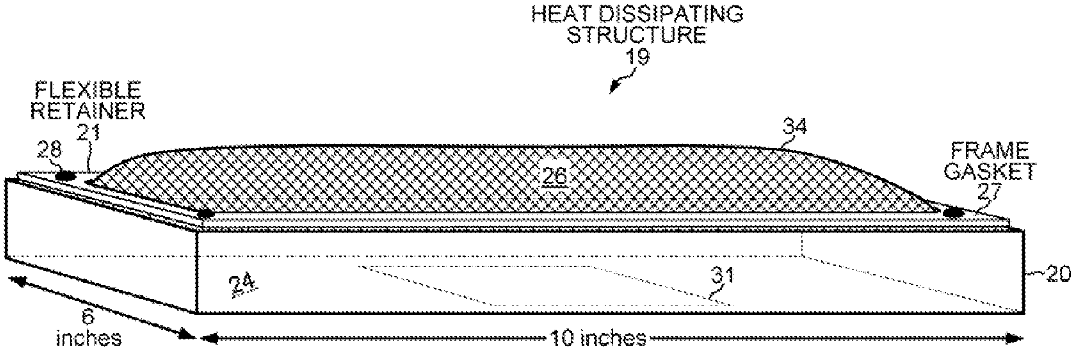
FIG. 4 is a side perspective view of the heat dissipating structure of FIG. 2 in which the metallic shavings are covered by a flexible retainer.

FIG. 4 is a side perspective view of conforming heat dissipating structure 19 that includes flexible retainer 21, open container 20 filled with metallic shavings 30 and platform 31 upon which LEDs 32 are mounted. The shavings 30 and balls 33 have been compressed into open container 20 using an arbor press such that the air pockets between the shavings and balls comprise less than 50% of the volume of the mixture of shavings and balls. Nevertheless, the upper surface of the compress of shavings and balls still protrudes well above upper rim 25 of open container 20. Flexible retainer 21 is fastened down over upper rim 25 such that the upper surface 34 of the metallic shavings 30 and metal balls 33 is pillow shaped. Four fasteners 28 pass through holes in frame gasket 27 of flexible retainer 21 and screw into holes 29 in the walls 23 of open container 20. The pillow top of conforming heat dissipating structure 19 acts like a sand bag and molds to any shape that upper surface 34 is pushed against.

Conforming heat dissipating structure 19 can be used as a heat transfer element to retrofit street lights by replacing halogen lights with LEDs. Typically, the retrofitted street lights do not have adequate vents or heat sinks to dissipate the heat produced by the LEDs. If the heat generated by the LEDs is to be transferred to the housing of the street light, there should be a large area of contact between the structure holding the LEDs and the housing in order to convey the heat generated by the LEDs to the outside surface of the street light housing. It is difficult to obtain the exact measurements of the concave surface of the street light housing in order to construct a solid metal heat sink that fits up against the inside of the upper cover of the street light housing. Constructing the solid metal heat sink would typically require a solid model to be made. In addition, a different solid metal heat sink to have to be constructed to match the specific shape of each type of street light. Alternatively, a malleable thermal compound could be molded like putty to an irregular surface. But with time and heat, thermal compounds tend to dry out, turn into powder and lose their thermal conductivity. Conforming heat dissipating structure 19 is the solution to making a tight, long-term contact between a heat dissipating structure and a large area of a non-planar surface that can absorb heat from the dissipating structure. For example, the pillow top of conforming heat dissipating structure 19 molds against any shape of the inside upper cover of a street light housing. Even though the mixture of shavings 30 and balls 33 has already been compressed once into open container 20 by the arbor press, the remaining air pockets between the shavings and balls are compressed further and permit the compress of shavings and balls to conform to the shape of the non-planar surface of the street light housing. Thereafter, the compress of copper shavings and balls maintains its shape when exposed to extreme heat over time.

Figure 5:
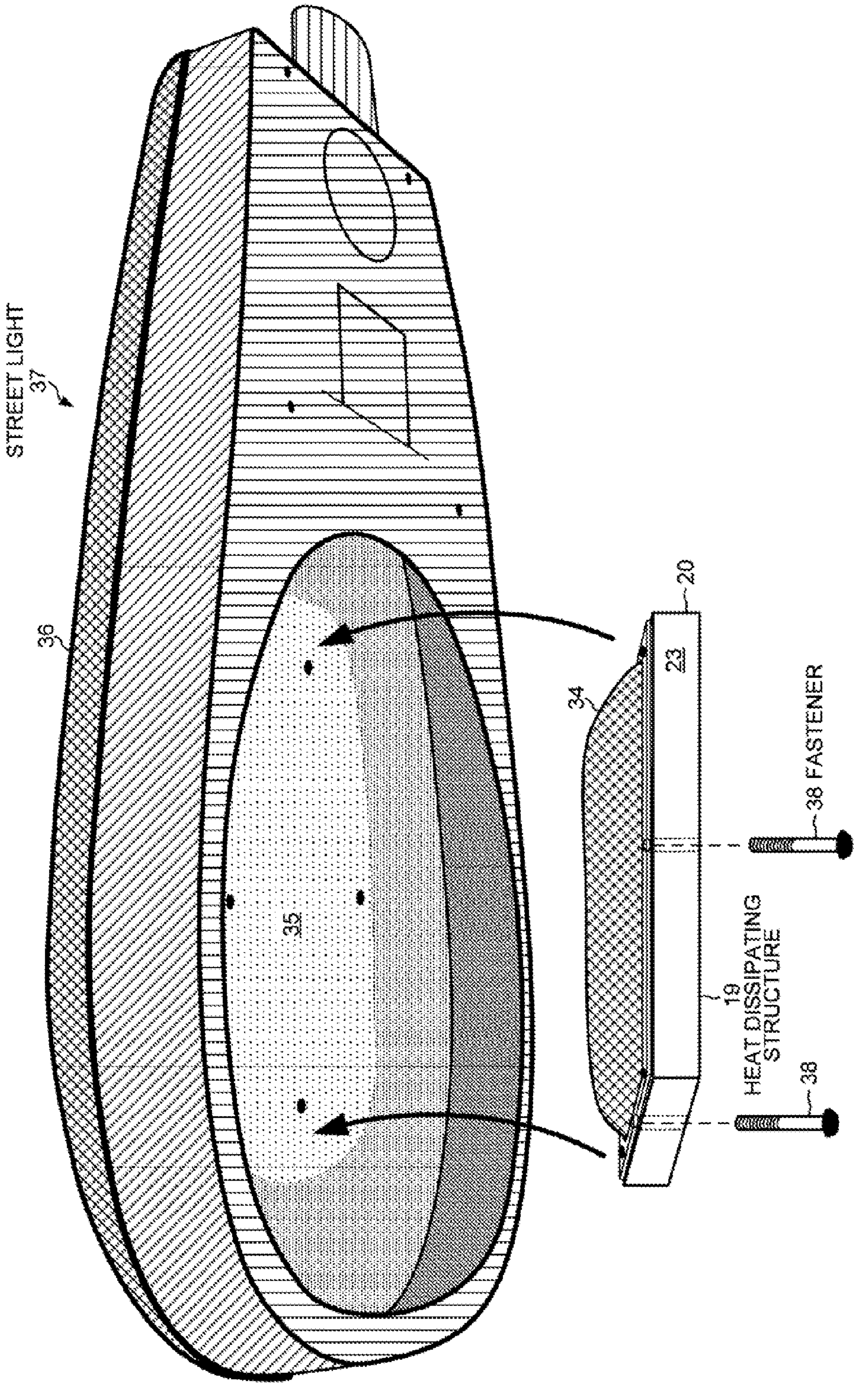
FIG. 5 is a perspective view of the heat dissipating structure of FIG. 2 being fit against the inside upper cover of a street light.

FIG. 5 shows conforming heat dissipating structure 19 being fit against the dome-shaped concave surface 35 of the upper cover 36 of a street light 37. Upper surface 34 of the metallic shavings 30 and metal balls 33 is pressed against concave surface 35 of street light 37. In an embodiment, an arbor press is used to press structure 19 against upper cover 36 and thereby compress the metallic shavings 30 and metal balls 33 and decrease the size of the air pockets between the shavings and balls. The volume occupied by air allows the copper shavings 30 and copper balls 33 to conform to the non-planar surface 35 as the shavings and balls are compressed. As the size of the air pockets decreases, the density of the shavings and balls increases. In an embodiment, a density is achieved in which the air pockets comprise less than 50% of the volume of the compress of shavings and balls. A compress of copper shavings and balls having less than 50% air pockets has a thermal conductivity that is greater than solid aluminum 6061, considering that copper has a thermal conductivity of 390 W/mK and aluminum 6061 has a thermal conductivity of 180 W/mK (Watts per meter-Kelvin). In an embodiment in which a graphite powder is added to the mixture of shavings and balls, air pockets comprise much less than 50% of the volume of the compress. In the embodiment in which graphite balls are mixed into graphite powder, there are practically no large air pockets remaining after the mixture is compressed.

After conforming heat dissipating structure 19 is pressed against upper cover 36, structure 19 is fastened to upper cover 36 by bolts 38 that pass through structure 19 and screw into holes in upper cover 36. Either the holes in upper cover 36 are threaded, or nuts on used to secure bolts 38 on the outside of upper cover 36. Bolts 38 act as fasteners to attach open container 20 to the non-planar surface 35 such that upper surface 34 of the metallic shavings 30 remains pressed against non-planar surface 35. By maintaining a large area of contact between structure 19 and upper cover 36, the heat generated by the LEDs 32 is dissipated out of the body of street light 37 without using fins, fans or venting slots. The LEDs 32 are able to achieve a longer service life because the heat they generated is dissipated out of the street light 37 through the upper cover 36.

In addition to retrofitting street lights, conforming heat dissipating structure 19 can be used to dissipate heat from a heat source to a non-planar cover of other lamps, such as traffic lights, yard lamps, bay lights and spot lights.

Figure 6:
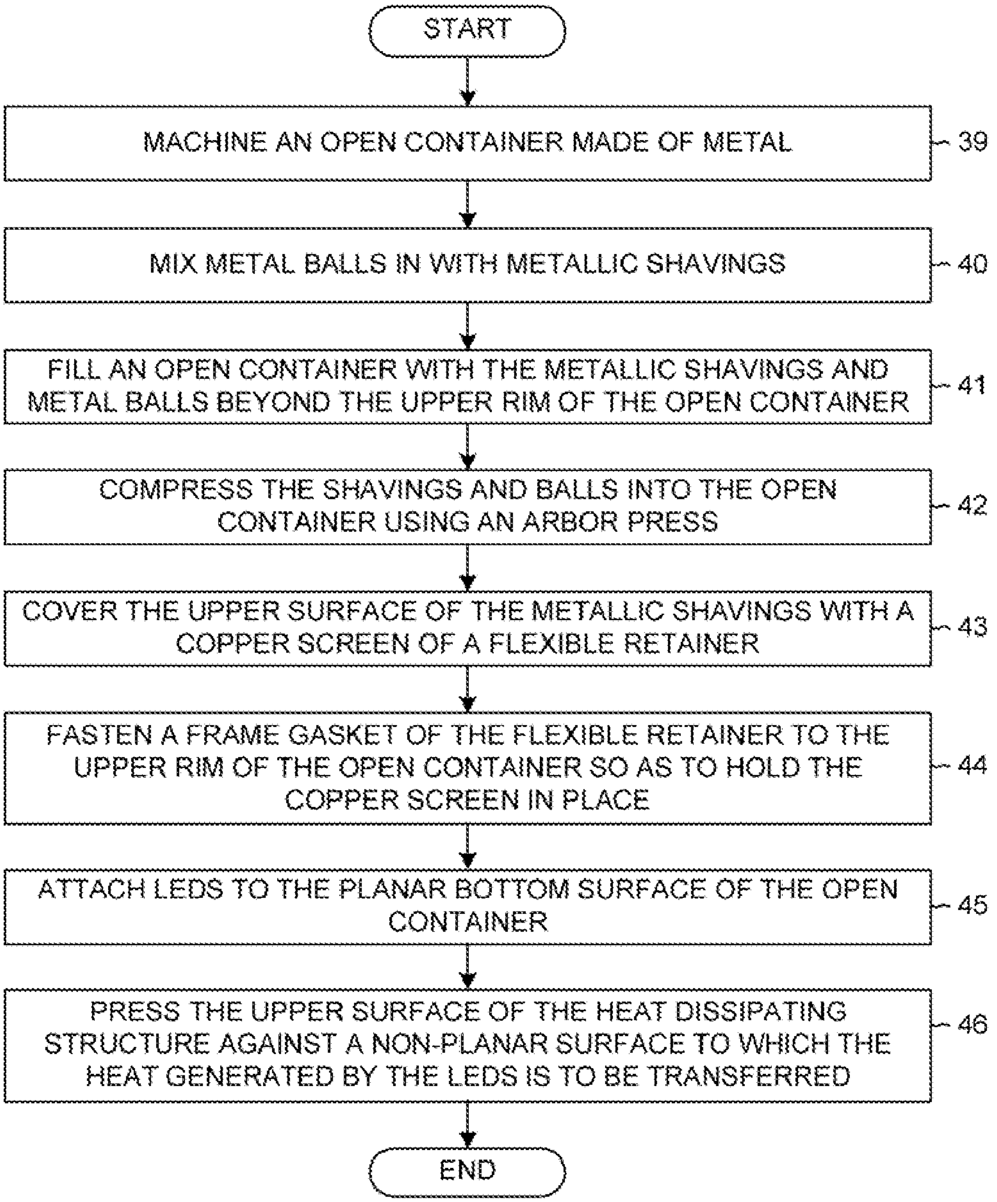
FIG. 6 is a flowchart of steps for manufacturing the conforming heat dissipating structure of FIG. 2.

FIG. 6 is a flowchart illustrating steps 39-45 of a method of manufacturing conforming heat dissipating structure 19.

In a first step 39, open container 20 made of metal is machined. For example, open container 20 is machined from a solid rectangular piece of copper. Four threaded holes 29 are drilled into open container 20 to accept the four fasteners 28, such as bolts.

In step 40, metal balls 33 are mixed in with metal shavings 30. Larger metal balls 33 are used for larger dimensioned open containers.

In step 41, open container 20 is filled with the mixture of metal shavings 30 and metal balls 33. Optionally, a final layer of just metal shavings is added on top of the mixture. Open container 20 is filled beyond upper rim 25 to form upper surface 34 of a mound of metallic shavings.

In step 42, the shavings 30 and balls 33 are compressed into open container 20 using an arbor press such that the air pockets between the shavings and balls comprise less than 50% of the volume of the mixture of shavings and balls. Nevertheless, upper surface 34 of the compress of shavings and balls still protrudes well above upper rim 25 of open container 20.

In step 43, upper surface 34 of metallic shavings 30 is covered with flexible retainer 21. Copper screen 26 is pulled down over the mound of metal shavings 30 and metal balls 33 and forms a pillow top.

In step 44, frame gasket 27 is fastened to upper rim 25 of open container 20 so as to hold copper screen 26 in place between upper rim 25 and frame gasket 27. Frame gasket 27 is fastened to upper rim 25 by screwing the bolts 28 into the threaded holes 29. Performing steps 39-43 produces conforming heat dissipating structure 19.

In step 45, an array of LEDs 32 is attached to the planar bottom surface 24 of open container 20. An aluminum platform 31 upon which the LEDs 32 are mounted is attached using thermal glue to bottom surface 24. Power wires used to provide the LEDs 32 with current are then attached to platform 31.

In step 46, heat dissipating structure 19 and the mounted LEDs 32 are attached to a non-planar surface to which the heat generated by the LEDs is to be transferred. For example, open container 20 is pressed against the inside dome-shaped concave surface 35 of the upper cover 36 of street light 37 (as shown in FIG. 5). An arbor press is used to press open container 20 against surface 35 so that the size of the air pockets between the shavings 30 and the balls 33 is reduced. In an embodiment, the mixture of shavings 30 and balls 33 is compressed between open container 20 and surface 35 until the air pockets between the shavings and balls occupy less than 50% of the volume of the space between open container 20 and surface 35. As the mixture is compressed, the metal shavings 30 at upper surface 34 mold to the contour of concave surface 35. When street light 37 is operating, heat generated by the LEDs 32 flows through bottom 22 of open container 20, through shavings 30 and balls 33, through copper screen 26 and to upper cover 36 of street light 37. The heat then escapes into the atmosphere from the outer, upper surface of upper cover 36.

Figure 7:
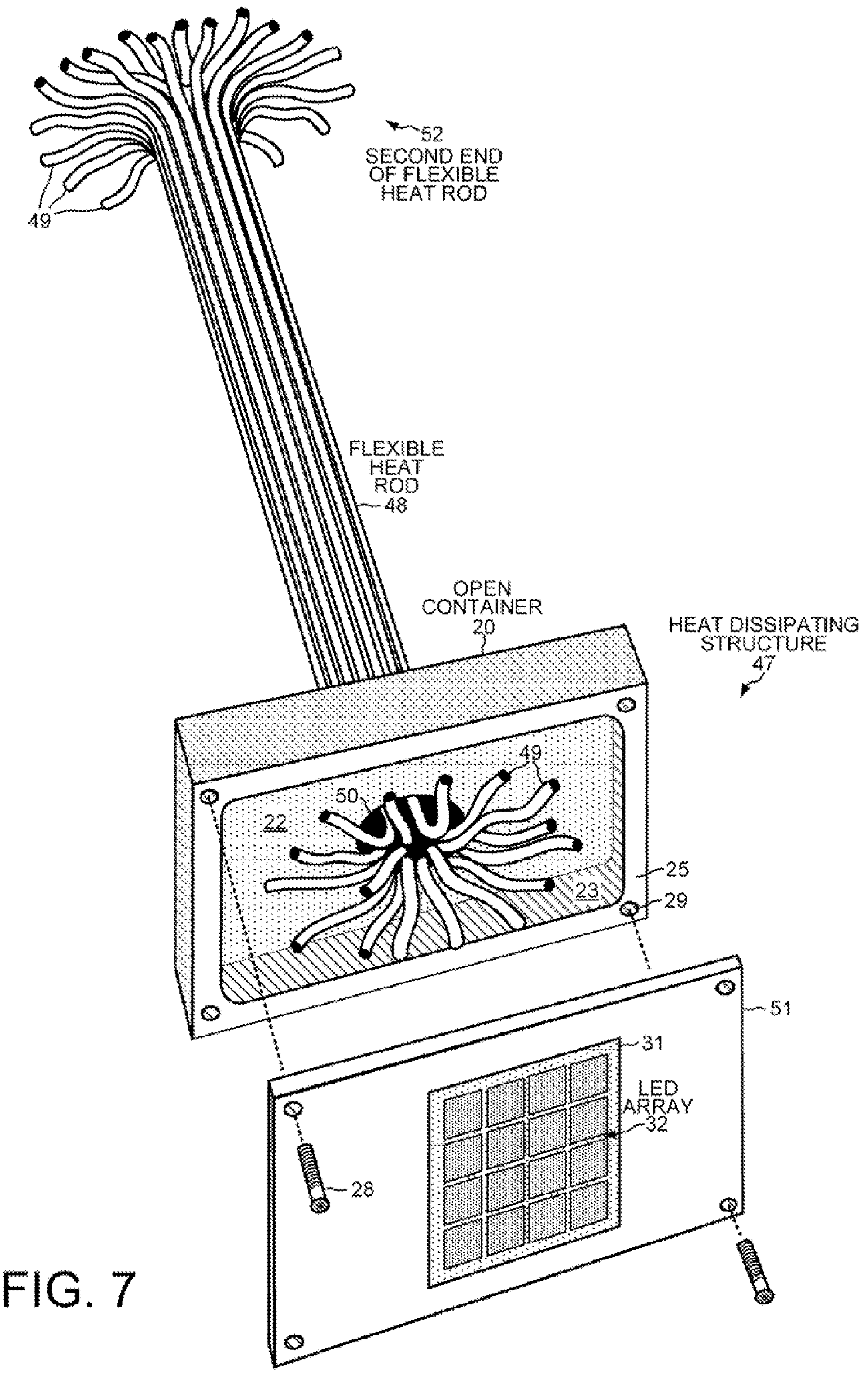
FIG. 7 is a perspective view of a heat dissipating structure with a flexible heat rod.

FIG. 7 is a perspective view of a heat dissipating structure 47 that is adapted to transfer heat over a flexible path from a heat source to a heat sink. The heat source is often located some distance away from where the heat is to be dissipated. For example, structural beams or walls may be located between the dome-shaped surface 35 of upper cover 36 of street light 37 and the most desirable location to place the LEDs 32. Or it may be necessary to locate the ac/dc driver block for the LEDs 32 between the LEDs and upper cover 36. A means is needed to direct the flow of heat around obstacles from a heat source, such as LEDs 32, to a heat sink, such as surface 35. A flexible heat rod 48 is used to transfer heat from heat dissipating structure 47 to heat dissipating structure 19. Heat dissipating structure 19 is located at the opposite end of flexible heat rod 48 from structure 47, but is not shown in FIG. 7.

Flexible heat rod 48 is a thick copper wire made of many strands 49. Flexible heat rod 48 can be made using a high-power transmission cable or the wire used to ground the lightning rod on a building. In the embodiment of FIG. 7, flexible heat rod 48 has a diameter of about one inch. One end of flexible heat rod 48 passes through a hole 50 in bottom 22 of heat dissipating structure 47. Hole 50 is formed to have the same diameter as the diameter of flexible heat rod 48. The other end of flexible heat rod 48 passes through another hole in the bottom of the open container of heat dissipating structure 19. FIG. 7 shows that the ends of the strands 49 are spread apart in a circular pattern inside open container 20. The strands 49 are dispersed throughout the volume of open container 20. Then the volume of open container 20 is filled around the strands 49 with a mixture of metallic shavings 30 and metal balls 33.

Figure 8:
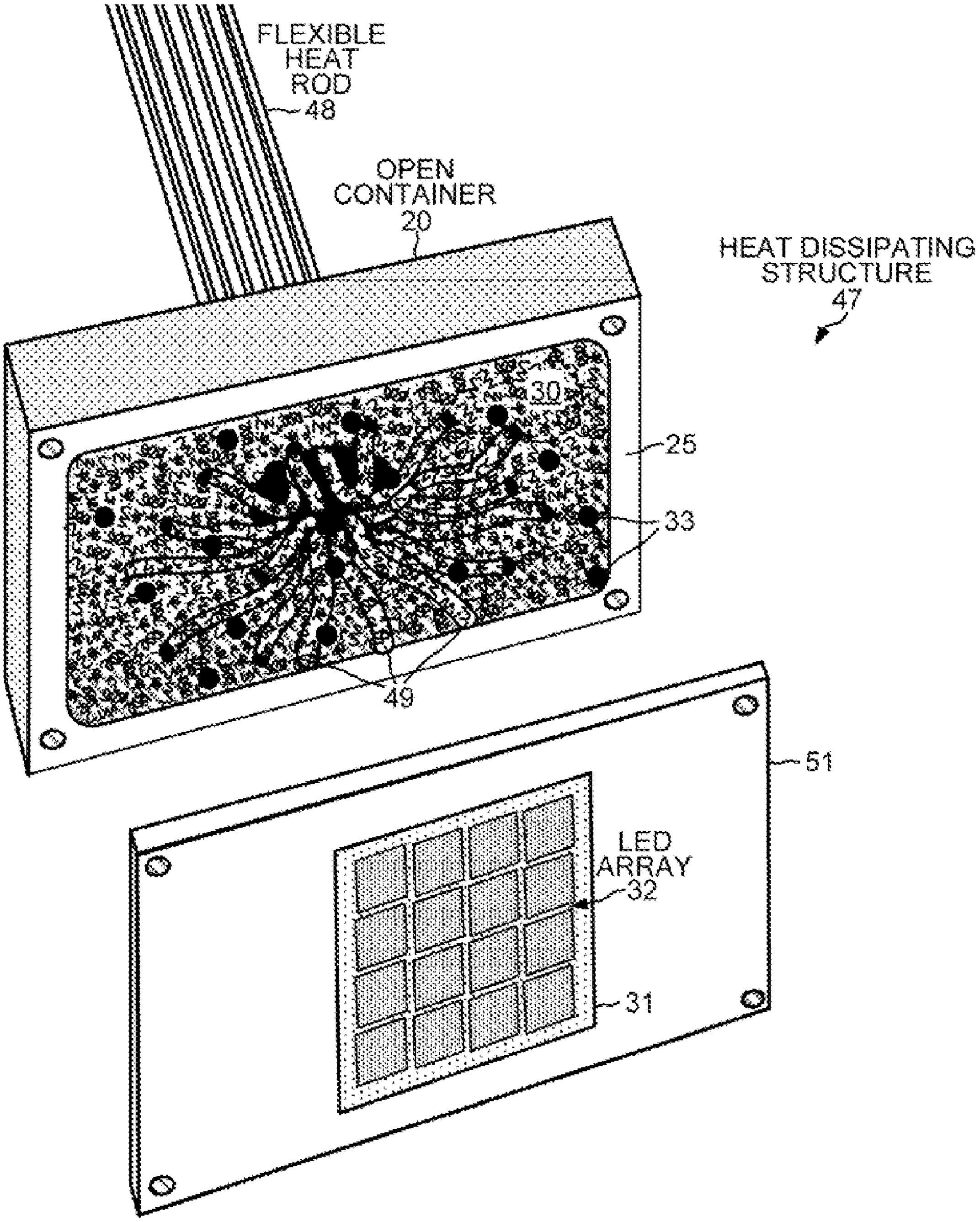
FIG. 8 is a perspective view of the flexible heat rod and heat dissipating structure of FIG. 7 filled with metallic shavings and metal balls.

FIG. 8 shows that metallic shavings 30 and metal balls 33 are disposed both beneath and over the strands 49. Heat dissipating structure 47 includes a planar retaining cover 51 upon which platform 31 and an array of LEDs 32 are mounted. Platform 31 is attached to retaining cover 51 using thermal glue. Retaining cover 51 is fastened to upper rim 25 of open container 20 and retains metallic shavings 30 and metal balls 33 inside open container 20. Open container 20 is first over-filled with the mixture of shavings and balls, and then the mixture is compressed between retaining cover 51 and bottom 22 such that the air pockets between the shavings and balls occupy less than 50% of the volume of the space between retaining cover 51 and bottom 22. In the compressed state, the metallic shavings 30 make contact with flexible heat rod 48 all along the sides of the individual strands 49 that are spread out inside open container 20. A much larger contact surface between the shavings and the sides of the multiple strands 49 allows a larger heat transfer than would be achievable by routing a solid rod of the same diameter as flexible heat rod 48 through the shavings. Retaining cover 51 is fastened to open container 20 by threaded bolts 28 that screw into holes 29 in open container 20, as shown in FIG. 7.

The second end 52 of flexible heat rod 48 passes through a hole in the bottom 22 of an open container 20 of a heat dissipating structure of the type shown in FIG. 2. The ends of the strands 49 are spread apart in a circular pattern inside the open container 20 of structure 19. Inside structure 19, metallic shavings 30 and metal balls 33 are also filled in around the strands 49 such that metallic shavings 30 make contact all along the sides of the individual strands 49 when the shavings and balls are compressed. Open container 20 of structure 19 is also over-filled with the mixture of shavings beyond upper rim 25 of the open container 20 of structure 19. Flexible retainer 21 covers the upper surface 34 of the shavings and balls.

Figure 9:
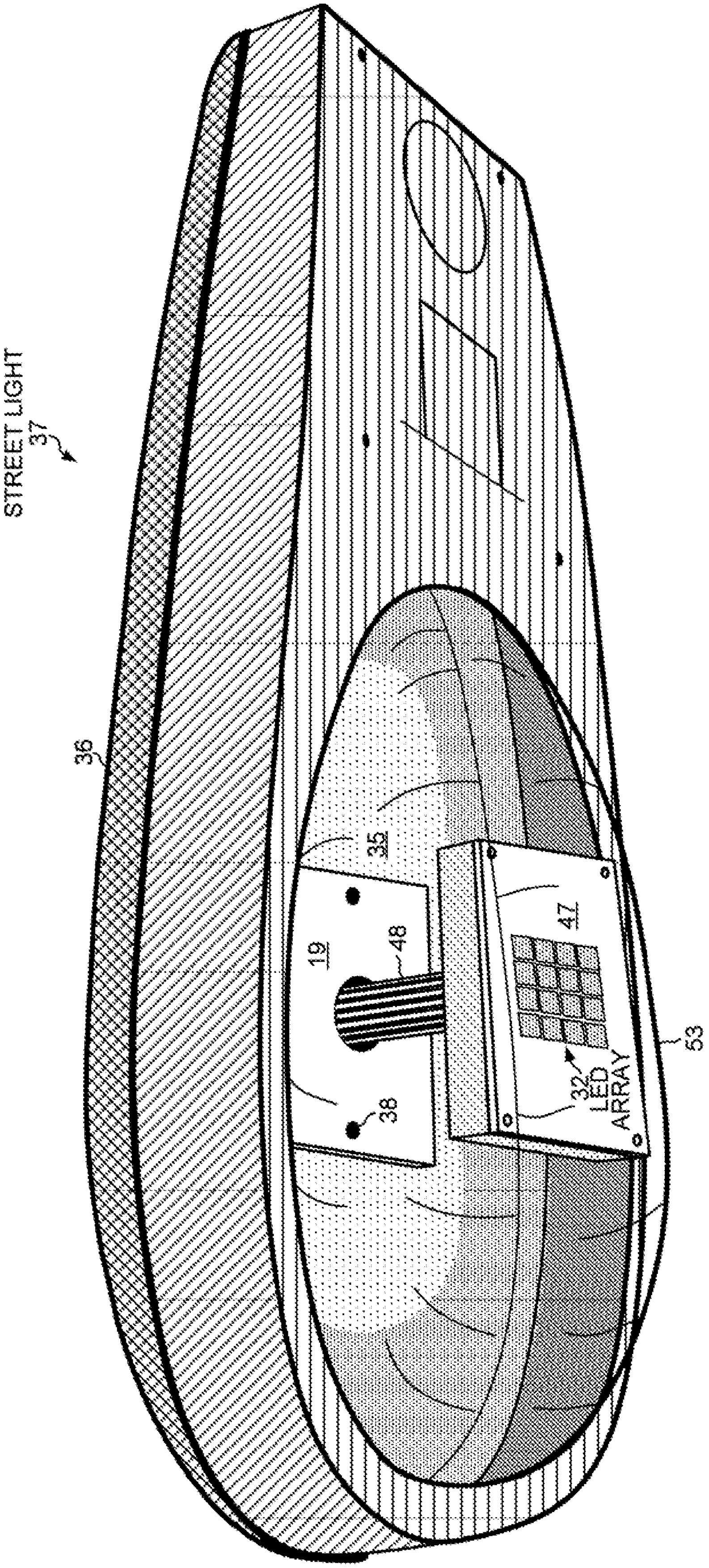
FIG. 9 is a perspective view of the flexible heat rod of FIG. 7 connecting heat dissipating structures in a street light.

FIG. 9 is a perspective view of the heat dissipating structures 19 and 47 being mounted in street light 37. As with the structure 19 of FIG. 5 that does not include flexible heat rod 48, the heat dissipating structure 19 of FIG. 9 that is attached to flexible heat rod 48 is also pressed against a non-planar surface to which heat is to be transferred. The shavings and balls that are held in place in structure 19 by copper screen 26 are pressed against concave surface 35 of street light 37 and assume the contour of surface 35. Bolts 38 act as fasteners to attach the open container 20 of structure 19 to non-planar surface 35. Flexible heat rod 48 allows an LED, an LED array, or an array of individual LEDs 32 to be positioned lower in street light 37 and closer to the glass lens 53. Flexible heat rod 48 could easily be bent to go around obstructions inside street light 37 between structures 47 and 19.

Flexible heat rod 48 is used in other applications besides retrofitting street light 37. For example, flexible heat rod 48 is used to lower the location of the LEDs in a bay light such that light is generated at the optimal position in the parabolic curve of the bay light. Yet the heat generated by the LEDs can be transmitted to the covering of the bay light, where it is dissipated into the atmosphere.

Figure 10:
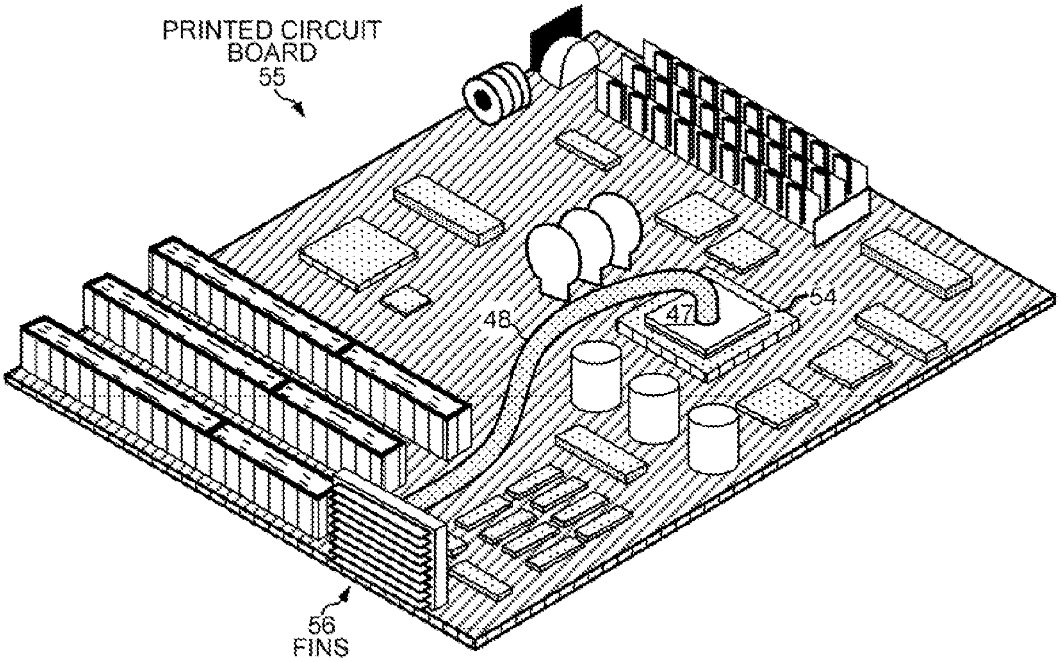
FIG. 10 is a perspective view of a flexible heat rod used on a printed circuit board to transfer heat away from a field programmable gate array chip.

FIG. 10 shows flexible heat rod 48 used in an application in which the heat source is not related to lighting. In an electronics application, flexible heat rod 48 is attached to a micro heat dissipating structure 47 that covers the top of a computer processing element, such as a large field-programmable gate array (FPGA) 54 mounted on a printed circuit board 55. Flexible heat rod 48 conducts the heat generated by FPGA 54 out from between cramped computer components to a location at which a fan can blow air through fins 56 attached to a heat dissipating structure at the opposite end of flexible heat rod 48. Flexible heat rod 48 can also be used to conduct heat away from other electronic components, such as a complex programmable logic device (CPLD), a central processing unit (CPU) or a stacked memory device.

Although certain specific embodiments are described above for instructional purposes, the teachings of this patent document have general applicability and are not limited to the specific embodiments described above. Although open container 20 of the heat dissipating structures is described above as having a rectangular box shape, open container 20 can have other shapes, such as an open oval box shape or a circular open box shape. Moreover, bottom 22 of open container 20 is described above as having one hole 50 through which one flexible heat rod 48 passes. In order to transfer more heat from each heat dissipating structure 47, multiple heat rods can be attached to the structure 47 through multiple holes. Accordingly, various modifications, adaptations, and combinations of various features of the described embodiments can be practiced without departing from the scope of the invention as set forth in the claims.

What is claimed is:

1. An apparatus, comprising:

an open container with an upper rim and a planar bottom surface;

metallic shavings disposed in the open container as well as above the upper rim, wherein the metallic shavings disposed above the upper rim have an upper surface;

a flexible retainer covering the upper surface of the metallic shavings; and fasteners adapted to attach the open container to a non-planar surface such that the upper surface of the metallic shavings is pressed against the non-planar surface.

2. The apparatus of claim 1, further comprising:

metal balls, wherein the metal balls are interspersed among the metallic shavings.

3. The apparatus of claim 1, wherein the open container and the metallic shavings are made of copper.

4. The apparatus of claim 1, further comprising:

a frame gasket, wherein a portion of the flexible retainer is held between the frame gasket and the upper rim.

5. The apparatus of claim 1, wherein the non-planar surface is an inside surface of a street lamp.

6. The apparatus of claim 1, wherein a heat source is attached to the planar bottom surface of the open container.

7. The apparatus of claim 6, wherein the heat source is a light-emitting diode.

8. The apparatus of claim 1, wherein the open container is machined from a solid piece of copper.

9. A method of manufacturing, comprising:

filling an open container with metallic shavings, wherein the open container has an upper rim and a planar bottom surface, and wherein the open container is filled with the metallic shavings beyond the upper rim to form an upper surface of metallic shavings;

covering the upper surface of metallic shavings with a flexible retainer; and fastening a frame gasket to the upper rim of the open container so as to hold the flexible retainer in place between the upper rim and the frame gasket.

10. The method of claim 9, wherein the filling the open container includes filling the open container with metal balls that are interspersed among the metallic shavings.

11. The method of claim 9, further comprising:

attaching the open container to a non-planar surface such that the upper surface of the metallic shavings is pressed against the non-planar surface.

12. The method of claim 9, wherein the open container includes fasteners adapted to attach the open container to a non-planar surface such that the upper surface of the metallic shavings is pressed against the non-planar surface.

13. The method of claim 12, wherein the non-planar surface is an inside surface of a street lamp.

14. The method of claim 9, wherein the open container and the metallic shavings are made of copper.

15. The method of claim 9, further comprising:

attaching a heat source to the planar bottom surface of the open container.

16. The method of claim 15, wherein the heat source is a light-emitting diode.

17. An apparatus comprising:

an open container with an upper rim and a planar bottom surface;

a heat source attached to the planar bottom surface; and means for transmitting heat generated by the heat source to a non-planar surface above the upper rim, wherein the means is disposed in the open container as well as above the upper rim, and wherein the means is adapted to be compressed between the open container and the non-planar surface.

18. The apparatus of claim 17, further comprising:

fasteners adapted to attach the open container to the non-planar surface such that the means is pressed against the non-planar surface.

19. The apparatus of claim 17, wherein the means includes metallic shavings.

20. The apparatus of claim 17, further comprising:

a flexible retainer that covers the means.

* * * * *